(12) United States Patent
Yu

(10) Patent No.: US 9,589,796 B2
(45) Date of Patent: Mar. 7, 2017

(54) METHOD OF DEFINING POLY-SILICON GROWTH DIRECTION

(71) Applicant: Shenzhen China Star Optoelectronics Technology Co., Ltd., Shenzhen, Guangdong (CN)

(72) Inventor: Wei Yu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 29 days.

(21) Appl. No.: 14/348,873

(22) PCT Filed: Jan. 21, 2014

(86) PCT No.: PCT/CN2014/070963
§ 371 (c)(1),
(2) Date: Mar. 31, 2014

(87) PCT Pub. No.: WO2015/100817
PCT Pub. Date: Jul. 9, 2015

(65) Prior Publication Data
US 2015/0249006 A1     Sep. 3, 2015

(30) Foreign Application Priority Data

Dec. 30, 2013   (CN) .......................... 2013 1 0747070

(51) Int. Cl.
*H01L 21/02*   (2006.01)
*H01L 21/3065* (2006.01)
*H01L 21/308*  (2006.01)

(52) U.S. Cl.
CPC ...... *H01L 21/0268* (2013.01); *H01L 21/0262* (2013.01); *H01L 21/02123* (2013.01);
(Continued)

(58) Field of Classification Search
CPC ........... H01L 21/0268; H01L 21/02123; H01L 21/02592
See application file for complete search history.

(56) References Cited

U.S. PATENT DOCUMENTS 6,432,758 B1   8/2002  Cheng
7,235,466 B2   6/2007  I-Chang
(Continued)

FOREIGN PATENT DOCUMENTS

CN      1501449 A    6/2004
CN      1588621 A    3/2005
TW       452892 B    9/2001

*Primary Examiner* — Duy T Nguyen
*Assistant Examiner* — Bo Bin Jang
(74) *Attorney, Agent, or Firm* — Andrew C. Cheng

(57) ABSTRACT

The present invention relates to a method of defining poly-silicon growth direction. The method of defining poly-silicon growth direction comprises Step 1, forming a buffer layer on a substrate; Step 2, forming an amorphous silicon thin film on the buffer layer; Step 3, forming regular amorphous silicon convex portions on the amorphous silicon thin film; and Step 4, transferring the amorphous silicon thin film into poly-silicon with an excimer laser anneal process. The growth direction of the poly-silicon as being formed can be controlled according to the present method of defining poly-silicon growth direction. Accordingly, the grain size of the poly-silicon can be raised.

14 Claims, 2 Drawing Sheets

(52) U.S. Cl.
CPC .. *H01L 21/02175* (2013.01); *H01L 21/02271* (2013.01); *H01L 21/02422* (2013.01); *H01L 21/02488* (2013.01); *H01L 21/02532* (2013.01); *H01L 21/02592* (2013.01); *H01L 21/02609* (2013.01); *H01L 21/02661* (2013.01); *H01L 21/02686* (2013.01); *H01L 21/3065* (2013.01); *H01L 21/3086* (2013.01)

(56) References Cited

U.S. PATENT DOCUMENTS

| | | | |
|---|---|---|---|
| 7,294,535 B1 * | 11/2007 | Yamazaki et al. | 438/149 |
| 2002/0110964 A1 * | 8/2002 | Cheng et al. | 438/166 |
| 2003/0183875 A1 * | 10/2003 | Isobe et al. | 257/347 |
| 2006/0246632 A1 * | 11/2006 | Okumura | 438/149 |
| 2007/0173046 A1 * | 7/2007 | Yamazaki et al. | 438/584 |

* cited by examiner

METHOD OF DEFINING POLY-SILICON GROWTH DIRECTION

BACKGROUND OF THE INVENTION

1. Field of the Invention

The present invention relates to the technical field of liquid crystal displaying, and in particular to a method of defining poly-silicon growth direction.

2. Description of Prior Art

With the development of the flat panel displays, the panels with higher resolution and lower power consumption are constantly required. Unlike the amorphous silicon, which the electron mobility is low, the low temperature poly-silicon can be produced under low temperature environment. With the high electron mobility and capability of manufacturing the C-MOS (Complementary Metal Oxide Semiconductor) circuit, the low temperature poly-silicon is widely discussed for meeting the requirement of high resolution and low power consumption.

The low temperature poly-silicon (LTPS) is a branch of poly-silicon technology. For the flat panel displays, the application of the poly-silicon liquid crystal material provides lots of merits. For example, the film circuit can be thinner, smaller and having lower power consumption.

In the initial developing stages of the poly-silicon technology, a laser anneal process, which is a high temperature oxidation process is necessary for transferring the structure of the glass substrate from amorphous silicon (a-Si) into poly-silicon. In this moment, the temperature of the glass substrate can reach over 1000 degree C. In comparison with the traditional high temperature poly-silicon, the laser exposure process is still required for the low temperature poly-silicon, thought. Nevertheless, an excimer laser is employed as being the heat source. After the laser is conducted through the transmission system, a laser beam with uniformly distributed energy is projected on the glass substrate with amorphous silicon structure. After the glass substrate with amorphous silicon structure absorbs the energy of the excimer laser, the glass substrate is then transferred into poly-silicon structure substrate. The whole process is accomplished under 500-600 degree C. Even a normal glass substrate can bare such temperature which enormously reduces the manufacture cost. Beside reduction of the manufacture cost, the low temperature poly-silicon technology further provides more merits: higher electron mobility; smaller film circuit area; higher resolution; simple structure and greater stability.

At present, several methods for producing the low temperature poly-silicon can be illustrated, such as solid phase crystallization (SPC), solid phase crystallization (SPC) and excimer laser anneal (ELA), among which excimer laser anneal (ELA) is the most widely used method nowadays.

The manufacture method of low temperature poly-silicon by excimer laser anneal is to grow a buffer layer on a glass. Then, amorphous silicon is grown thereon. After the high temperature dehydrogenation process and the HF precleaning process, the laser of the ELA scans the amorphous silicon. The amorphous silicon melts at very high temperature and re-crystallized into poly-silicon.

The grain size of the low temperature poly-silicon possesses quite significant effect to the electricity of the poly-silicon. During the ELA process, the amorphous silicon suffered with the high temperature and nearly completely melts. Then, the re-crystallization into poly-silicon of the amorphous silicon accomplished. As being re-crystallized, the occurrence of crystallization follows the direction from low energy toward high energy, i.e. crystallization occurs from the low temperature area toward the high temperature area; the start point and the direction of crystallization are in a mess. Consequently, the grain size is too small and too many grain boundaries appear. Accordingly, electron mobility of the poly-silicon can be significantly affected.

SUMMARY OF THE INVENTION

Thus, an objective of the present invention is to provide a method of defining poly-silicon growth direction to control the growth direction of the poly-silicon as being formed.

To achieve the objective, the present invention provides a method of defining poly-silicon growth direction, comprising:

Step 1, forming a buffer layer on a substrate;

Step 2, forming an amorphous silicon thin film on the buffer layer;

Step 3, forming regular amorphous silicon convex portions on the amorphous silicon thin film; and Step 4, transferring the amorphous silicon thin film into poly-silicon with an excimer laser anneal process.

Step 3 further comprises:

Step 3.1, performing a photolithography process of forming photoresist on the amorphous silicon thin film according the amorphous silicon convex portions to be formed;

Step 3.2, dry etching the amorphous silicon thin film; and

Step 3.3, stripping the photoresist.

The amorphous silicon thin film is treated by a high temperature dehydrogenation process and a HF precleaning process before the excimer laser anneal process in Step 4 is performed.

A material of the buffer layer is silicon nitride or silicon dioxide.

The substrate is glass.

The distribution of the amorphous silicon convex portions on the surface of amorphous silicon thin film is preset according to poly-silicon growth direction to be defined in Step 4.

The buffer layer and the amorphous silicon thin film are respectively formed by a chemical vapor deposition process.

An insulation layer is further formed between the substrate and the buffer layer.

A material of the insulation layer is aluminum nitride, boron nitride, aluminum oxide or magnesium oxide.

The insulation layer is formed by a magnetron sputtering process or a chemical vapor deposition process.

The present invention also provides a method of defining poly-silicon growth direction, comprising:

Step 1, forming a buffer layer on a substrate;

Step 2, forming an amorphous silicon thin film on the buffer layer;

Step 3, forming regular amorphous silicon convex portions on the amorphous silicon thin film; and Step 4, transferring the amorphous silicon thin film into poly-silicon with an excimer laser anneal process, wherein Step 3 further comprises:

Step 3.1, performing a photolithography process of forming photoresist on the amorphous silicon thin film according the amorphous silicon convex portions to be formed;

Step 3.2, dry etching the amorphous silicon thin film; and

Step 3.3, stripping the photoresist; and wherein before the excimer laser anneal process in Step 4 is performed, amorphous silicon thin film is treated by a high temperature dehydrogenation process and a HF precleaning process, and a material of the buffer layer is silicon nitride or silicon dioxide, and the substrate is glass, and wherein distribution of the amorphous silicon convex portions on the surface of amorphous silicon thin film is preset according to poly-silicon growth direction to be defined in Step 4.

The buffer layer and the amorphous silicon thin film are respectively formed by a chemical vapor deposition process.

An insulation layer is further formed between the substrate and the buffer layer.

A material of the insulation layer is aluminum nitride, boron nitride, aluminum oxide or magnesium oxide.

The insulation layer is formed by a magnetron sputtering process or a chemical vapor deposition process.

The growth direction of the poly-silicon as being formed can be controlled according to the present method of defining poly-silicon growth direction. Accordingly, the grain size of the poly-silicon can be raised.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

Figure 1:
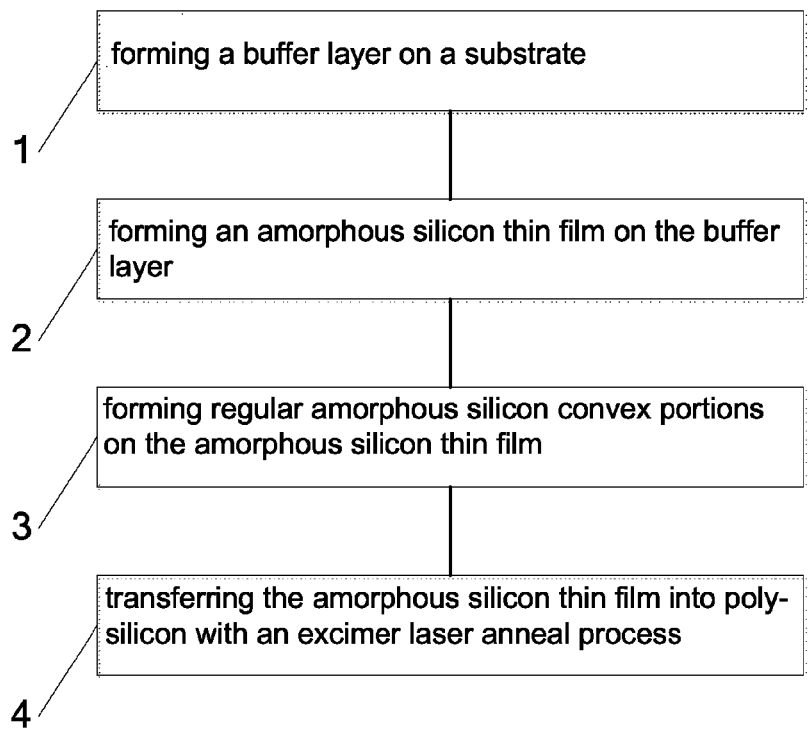
FIG. 1 is a flowchart of a method of defining poly-silicon growth direction according to the present invention.

Referring to FIG. 1, which is a flowchart of a method of defining poly-silicon growth direction according to the present invention. With a preferable embodiment of the method of defining poly-silicon growth direction according to the present invention shown in FIGS. 2-5, the method of defining poly-silicon growth direction according to the present invention comprises:

Step 1, forming a buffer layer 20 on a substrate 10; the substrate can be glass or other proper transparent material.

Step 2, forming an amorphous silicon thin film on the buffer layer 20; a material of the buffer layer can be silicon nitride, silicon dioxide or other proper material.

Figure 2:
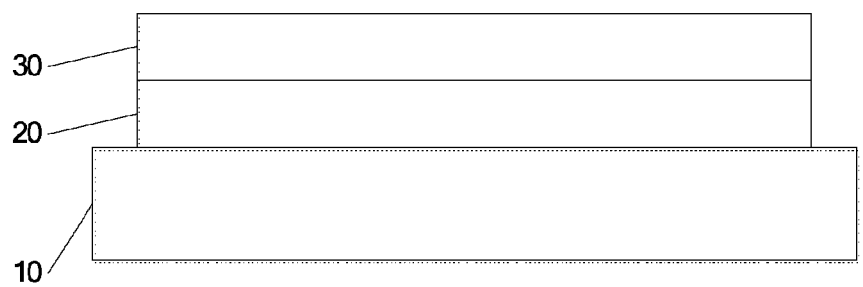
FIG. 2 is a sectional view diagram of an amorphous silicon thin film formed according to the method of defining poly-silicon growth direction of the present invention.

Referring to FIG. 2, which is a sectional view diagram of a grapheme array formed according to the method of defining poly-silicon growth direction of the present invention. The buffer layer 20 is grown on the substrate 10. Then, the amorphous silicon thin film 30 is formed on the buffer layer 20. The buffer layer 20 can be formed by a chemical vapor deposition process or other proper manufacture processes.

Step 3 can comprises:

Step 3.1, performing a photolithography process of forming photoresist on the amorphous silicon thin film 30 according the amorphous silicon convex portions 40 to be formed;

Step 3.2, dry etching the amorphous silicon thin film 30; and

Step 3.3, stripping the photoresist.

The amorphous silicon thin film 30 also can be formed by other manufacture processes.

Figure 3:
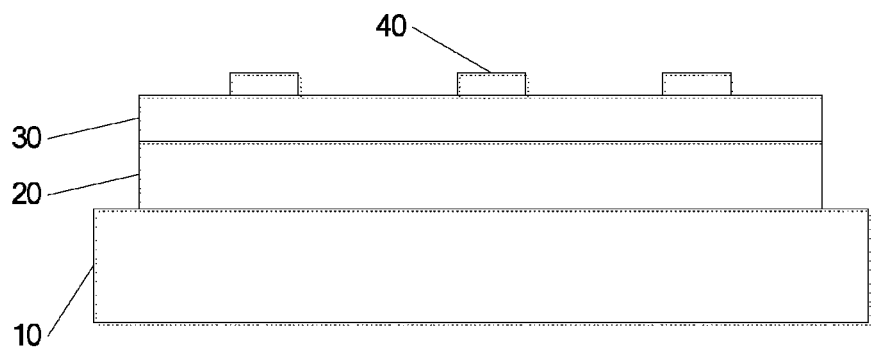
FIG. 3 is a sectional view diagram of the amorphous silicon thin film after dry etching according to the method of defining poly-silicon growth direction of the present invention.

Referring to FIG. 3, which is a sectional view diagram of the amorphous silicon thin film after dry etching according to the method of defining poly-silicon growth direction of the present invention. After the aforesaid photolithography process, dry etching process and stripping process are performed, a plurality of regular amorphous silicon convex portions 40 is formed on the amorphous silicon thin film 30. Specifically, the amorphous silicon thin film 30 is partially etched in the dry etching process. The convex portions 40 are formed.

Specifically, a photosensitive material, which is so called photoresist, is coated on the amorphous silicon thin film 30. Then, the light irradiates the photoresist through a mask positioned on the photoresist to make the photoresist to be exposed. The mask comprises pattern in accordance with the amorphous silicon convex portions 40 to be formed. Therefore, portion of the light can travel through the mask to irradiate the photoresist. Selectively, the exposure of the photoresist is realized to transfer the pattern of the mask onto the photoresist. Then, with some proper developer for removing portion of the photoresist and the required pattern appears on the photoresist. After that, the amorphous silicon thin film 30 is partially removed in the dry etching process. Finally, the rest pattern of the photoresist will be entirely stripped.

Step 4 is performed, which the amorphous silicon thin film 40 is transferred into poly-silicon with an excimer laser anneal process.

Figure 4:
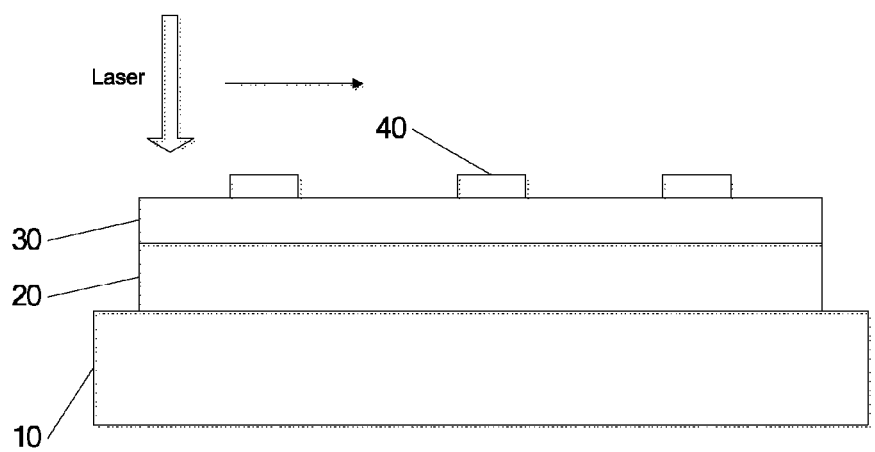
FIG. 4 is a sectional view diagram of the amorphous silicon thin film in the excimer laser anneal process according to the method of defining poly-silicon growth direction of the present invention.
Figure 5:
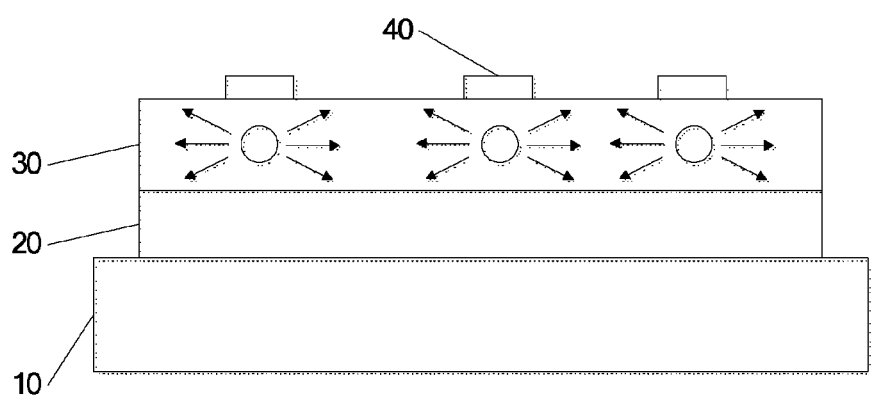
FIG. 5 is a sectional view diagram of seed crystal control for poly-silicon growth direction of the amorphous silicon thin film according to the method of defining poly-silicon growth direction of the present invention.

Please refer to FIGS. 4 and 5. FIG. 4 is a sectional view diagram of the amorphous silicon thin film in the excimer laser anneal process according to the method of defining poly-silicon growth direction of the present invention. FIG. 5 is a sectional view diagram of seed crystal control for poly-silicon growth direction of the amorphous silicon thin film according to the method of defining poly-silicon growth direction of the present invention. In the excimer laser anneal process, the amorphous silicon thin film 30 is suffered with the high temperature. The amorphous silicon thin film 30 in the thin area nearly completely melts. The amorphous silicon convex portions 40 merely partially melts and the energy here is lower because of the larger thickness. As shown in FIG. 5, the amorphous silicon of the amorphous silicon convex portions 40 which does not melt, is employed as seed crystal for the poly-silicon growth and is employed to control the poly-silicon to grow and form around. Consequently, the objective of controlling the growth direction of the poly-silicon can be realized. Accordingly, the grain size of the poly-silicon can be raised.

By employing the method of the present invention, the seed crystal is formed in the amorphous silicon thin film 30. The poly-silicon starts growing and becomes larger from the seed crystal. Accordingly, the objective of controlling the growth direction of the poly-silicon can be realized. Consequently, the grain size of the poly-silicon can be raised. Before starting to grow the poly-silicon, the distribution of the amorphous silicon convex portions 40 on the surface of the amorphous silicon thin film 30 are preset according to poly-silicon growth direction to be defined. For example, the amorphous silicon convex portions 40 can be preset with the same appearance and uniformly distributed on the surface of the amorphous silicon thin film 30. Namely, by changing conditions of appearance and position of the amorphous silicon convex portions 40, the poly-silicon growth direction as being formed can possibly be changed.

Moreover, an insulation layer can be formed between the substrate 10 and the buffer layer 20. A material of the insulation layer is aluminum nitride, boron nitride, aluminum oxide, magnesium oxide or other proper materials. The insulation layer can be formed by a magnetron sputtering process, a chemical vapor deposition process, or other proper manufacture processes. Besides, the method of defining poly-silicon growth direction according to the present invention can be applied for manufactures of thin film transistors, array substrates, flat panel displays and etc.

In conclusion, the growth direction of the poly-silicon as being formed can be controlled according to the present method of defining poly-silicon growth direction. Accordingly, the grain size of the poly-silicon can be raised.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method of defining poly-silicon growth direction, comprising:
    Step 1, forming a buffer layer on a substrate;
    Step 2, forming an amorphous silicon thin film on the buffer layer;
    Step 3, forming a plurality of amorphous silicon convex portions having predetermined appearances and regularly distributed on a surface of the amorphous silicon thin film and a plurality of troughs alternating with the convex portions so as to define a corrugated configuration of the surface of the amorphous silicon thin film, wherein the convex portions have a first thickness of amorphous silicon and the troughs have a second thickness of amorphous silicon that is smaller than the first thickness by a predetermined amount of thickness difference; and
    Step 4, transferring the amorphous silicon thin film into poly-silicon with an excimer laser anneal process such that the excimer laser anneal process allows the amorphous silicon of each of the convex portions to partly melt and a non-melted portion of the amorphous silicon of each of the convex portions is preserved to serve as a seed crystal for growth of poly-silicon in the convex portion in a poly-silicon growth direction, wherein a surface portion of each of the convex portions receives a first amount of energy during the excimer laser anneal process and a deep portion of each of the convex portions is shielded by the predetermined amount of thickness difference between the first and second thicknesses so as to receive a second amount of energy that is less than the first amount of energy during the excimer laser anneal process and thus maintain in a non-melted condition,
    wherein the poly-silicon growth direction is selectively variable through varying the appearances of the convex portions, wherein distribution of the amorphous silicon convex portions on the surface of the amorphous silicon thin film is preset according to the poly-silicon growth direction in Step 4.

2. The method of defining poly-silicon growth direction as claimed in claim 1, wherein Step 3 further comprises:
    Step 3.1, performing a photolithography process of forming photoresist on the amorphous silicon thin film according the amorphous silicon convex portions to be formed;
    Step 3.2, dry etching the amorphous silicon thin film; and
    Step 3.3, stripping the photoresist.

3. The method of defining poly-silicon growth direction as claimed in claim 1, wherein the amorphous silicon thin film is treated by a high temperature dehydrogenation process and a HF precleaning process before the excimer laser anneal process in Step 4 is performed.

4. The method of defining poly-silicon growth direction as claimed in claim 1, wherein a material of the buffer layer is silicon nitride or silicon dioxide.

5. The method of defining poly-silicon growth direction as claimed in claim 1, wherein the substrate is glass.

6. The method of defining poly-silicon growth direction as claimed in claim 1, wherein the buffer layer and the amorphous silicon thin film are respectively formed by a chemical vapor deposition process.

7. The method of defining poly-silicon growth direction as claimed in claim 1, wherein an insulation layer is further formed between the substrate and the buffer layer.

8. The method of defining poly-silicon growth direction as claimed in claim 7, wherein a material of the insulation layer is aluminum nitride, boron nitride, aluminum oxide or magnesium oxide.

9. The method of defining poly-silicon growth direction as claimed in claim 7, wherein the insulation layer is formed by a magnetron sputtering processor or a chemical vapor deposition process.

10. A method of defining poly-silicon growth direction, comprising:
    Step 1, forming a buffer layer on a substrate;
    Step 2, forming an amorphous silicon thin film on the buffer layer;
    Step 3, forming a plurality of amorphous silicon convex portions having predetermined appearances and regularly distributed on a surface of the amorphous silicon thin film and a plurality of troughs alternating with the convex portions so as to define a corrugated configuration of the surface of the amorphous silicon thin film, wherein the convex portions have a first thickness of amorphous silicon and the troughs have a second thickness of amorphous silicon that is smaller than the first thickness by a predetermined amount of thickness difference; and
    Step 4, transferring the amorphous silicon thin film into poly-silicon with an excimer laser anneal process such that the excimer laser anneal process allows the amorphous silicon of each of the convex portions to partly melt and a non-melted portion of the amorphous silicon of each of the convex portions is preserved to serve as a seed crystal for growth of poly-silicon in the convex portion in a poly-silicon growth direction, wherein a surface portion of each of the convex portions receives a first amount of energy during the excimer laser anneal process and a deep portion of each of the convex portions is shielded by the predetermined amount of thickness difference between the first and second thicknesses so as to receive a second amount of energy that is less than the first amount of energy during the excimer laser anneal process and thus maintain in a non-melted condition, wherein the poly-silicon growth direction is selectively variable through varying the appearances of the convex portions;

wherein Step 3 further comprises:

Step 3.1, performing a photolithography process of forming photoresist on the amorphous silicon thin film according the amorphous silicon convex portions to be formed;

Step 3.2, dry etching the amorphous silicon thin film; and

Step 3.3, stripping the photoresist; and wherein before the excimer laser anneal process in Step 4 is performed, the amorphous silicon thin film is treated by a high temperature dehydrogenation process and a HF precleaning process, and a material of the buffer layer is silicon nitride or silicon dioxide, and the substrate is glass, and wherein distribution of the amorphous silicon convex portions on the surface of the amorphous silicon thin film is preset according to the poly-silicon growth direction in Step 4.

11. The method of defining poly-silicon growth direction as claimed in claim 10, wherein the buffer layer and the amorphous silicon thin film are respectively formed by a chemical vapor deposition process.

12. The method of defining poly-silicon growth direction as claimed in claim 10, wherein an insulation layer is further formed between the substrate and the buffer layer.

13. The method of defining poly-silicon growth direction as claimed in claim 12, wherein a material of the insulation layer is aluminum nitride, boron nitride, aluminum oxide or magnesium oxide.

14. The method of defining poly-silicon growth direction as claimed in claim 12, wherein the insulation layer is formed by a magnetron sputtering process or a chemical vapor deposition process.

* * * * *